(12) United States Patent
Vaufrey et al.

(10) Patent No.: US 9,214,341 B2
(45) Date of Patent: Dec. 15, 2015

(54) METHOD FOR MANUFACTURING A SEMICONDUCTOR STRUCTURE AND SEMICONDUCTOR COMPONENT COMPRISING SUCH A STRUCTURE

(71) Applicant: COMMISSARIAT A L'ENERGIE ATOMIQUE ET AUX ENE ALT, Paris (FR)

(72) Inventors: David Vaufrey, Grenoble (FR); Hubert Bono, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/062,024

(22) Filed: Oct. 24, 2013

(65) Prior Publication Data
US 2014/0120702 A1    May 1, 2014

Related U.S. Application Data

(60) Provisional application No. 61/733,492, filed on Dec. 5, 2012.

(30) Foreign Application Priority Data

Oct. 26, 2012    (FR) ..................... 12 60234

(51) Int. Cl.
| H01L 21/20 | (2006.01) |
| H01L 21/36 | (2006.01) |
| H01L 21/28 | (2006.01) |
| H01L 21/3205 | (2006.01) |
| H01L 21/02 | (2006.01) |

(52) U.S. Cl.
CPC ...... *H01L 21/02617* (2013.01); *H01L 21/0242* (2013.01); *H01L 21/0245* (2013.01);
(Continued)

(58) Field of Classification Search
CPC .............. H01L 21/02378; H01L 21/0242; H01L 21/0245; H01L 21/02463; H01L 21/02645; H01L 21/0262; H01L 21/0254; H01L 29/0673; H01L 21/02568; H01L 29/0665; H01L 21/02639; H01L 31/0322; H01L 33/0075; H01L 33/20; H01L 33/32
USPC .......... 438/478, 604; 257/E21.085, 257/E33.023–E33.026, E33.049
See application file for complete search history.

(56) References Cited

U.S. PATENT DOCUMENTS

| 8,039,854 B2 | 10/2011 | Hersee et al. |
| 2007/0108466 A1 | 5/2007 | Kryliouk et al. |

FOREIGN PATENT DOCUMENTS

| KR | 10-2006-0118845 | 11/2006 |
| KR | 10-2006-0118845 A | 11/2006 |

(Continued)

OTHER PUBLICATIONS

French Preliminary Search Report issued May 17, 2013, in French Application No. 1260234.
(Continued)

*Primary Examiner* — Michelle Mandala
(74) *Attorney, Agent, or Firm* — Oblon, McClelland, Maier & Neustadt, L.L.P.

(57) ABSTRACT

Method for manufacturing at least one semiconductor structure (130) on the surface (105) of a substrate (100) wherein the surface comprises silicon. The method comprises steps consisting of providing the substrate (100), forming in contact with an area (101) of the surface (105), referred to as the formation area, a layer (120) of a first material, the remainder (102) of the surface (105), referred to as the free area, remaining free from the first material, the dimensions of the formation area (101) and the first material being suitable for forming the structure (130), the first material comprising gallium, the formation of said layer (120) taking place at a temperature less than 600° C., and forming the structure (130) in contact with the layer (120).

8 Claims, 3 Drawing Sheets

(52) U.S. Cl.
CPC ...... *H01L21/0254* (2013.01); *H01L 21/02378* (2013.01); *H01L 21/02381* (2013.01); *H01L 21/02458* (2013.01); *H01L 21/02463* (2013.01); *H01L 21/02603* (2013.01); *H01L 21/02645* (2013.01)

(56) References Cited

FOREIGN PATENT DOCUMENTS

| WO | WO 2009/009612 | A2 | 1/2009 |
| WO | WO 2009/009612 | A3 | 1/2009 |
| WO | WO 2009/009612 | A9 | 1/2009 |
| WO | WO 2012/050888 | A2 | 4/2012 |
| WO | WO 2012/050888 | A3 | 4/2012 |
| WO | WO 2012/075461 | A1 | 6/2012 |

OTHER PUBLICATIONS

French Preliminary Search Report issued May 17, 2013 in French application 12 60234, filed on Oct. 26, 2012 (with English Translation of category of Cited Documents).
U.S. Appl. No. 14/704,407, filed May 5, 2015, Bialic, et al.
U.S. Appl. No. 14/748,707, filed Jun. 24, 2015, Bono, et al.
U.S. Appl. No. 14/750,156, Jun. 25, 2015, Robin, et al.

METHOD FOR MANUFACTURING A SEMICONDUCTOR STRUCTURE AND SEMICONDUCTOR COMPONENT COMPRISING SUCH A STRUCTURE

FIELD OF THE INVENTION

The invention relates to the field of electronic and optoelectronic components based on semiconductor structures.

In the aim of enhancing the performances of semiconductor components, research in this field has focused on structures of micrometric or even nanometric sizes.

Indeed, the use of such structures offers a number of advantages. These advantages particularly include the fact that such structures offer the option of developing components which are no longer planar but three-dimensional. In this way, the functional surface area of the component is increased significantly without significantly increasing the dimensions thereof. This is particularly the case of semiconductor wires.

Of the areas of research on these structures, and on semiconductor wires in particular, optimising methods for the controlled manufacture thereof remains a priority.

In this way, the invention particularly relates to a method for manufacturing a semiconductor structure and a semiconductor component.

STATE OF THE RELATED ART

Controlled manufacturing methods of semiconductor structures such as gallium nitride (GaN) wires should account for the constraints associated with the type of semiconductor structures and the constituent materials thereof, and the constraints associated with the constituent materials of the substrate.

Indeed, the method generally used for forming structures on a substrate consists of depositing the material wherein the structures are to be formed. This deposition is carried out in such a way that the material to be deposited only grows selectively on some areas of the substrate, referred to as formation areas. This selective growth may be obtained in various ways according to the constituent materials of the structures and the material of the substrate surface.

In this way, obtaining this growth selectivity by previously and locally modifying the formation areas, for example by means of surface texturing, so as to form nucleation centres for the material to be deposited features in the prior art. In this way, the nucleation energy on the formation areas is lowered, making it possible to promote the growth of said material on the modified areas. During the deposition of the material to be deposited on the substrate surface, the material would thus grow preferentially on the formation areas and form seeds for structure growth. After seed formation, the difference in material nucleation energy between the substrate and the seeds significantly promotes the deposition of the material on the seeds and enables selective growth. Structures are thus only formed on the formation areas.

While such a method enables controlled structure formation on a substrate surface, it nonetheless involves a major drawback. Indeed, the methods for modifying the surface are local and thus sequential methods, such as near field microscopy or ion beam focussing surface modification techniques. As a result, in order to manufacture structures on large areas, such as that of a 20 cm diameter silicon wafer, the surface modification step takes a long time which is not very compatible with mass production constraints.

The prior art also features, particularly U.S. Pat. No. 8,039,854, obtaining growth selectivity of a material to be deposited by means of a mask previously deposited on the substrate surface. In such a method, the mask is made of a material whereon the growth of the material to be deposited is reduced or even inhibited. The mask is also configured so as to only leave the formation areas free. In this way, the material to be deposited can only grow on the formation areas, the growth thereof on the rest of the substrate surface being limited.

This method offers the advantage of being compatible, in order to free the formation areas, with photolithography methods. In this way, the steps required to form the mask, particularly the step for freeing the formation areas, may be carried out in parallel on the entire substrate surface regardless of the size of the substrate. In this way, since this method does not require the use of a local and thus sequential surface modification method and thus does not have any incompatible step with mass production constraints.

Nevertheless, whether the production method used is a sequential production method or a parallel production method, a method for manufacturing structures comprising gallium (Ga) on a surface comprising silicon remains particularly problematic in that a silicon (Si) etching phenomenon with gallium (Ga) competes with the crystallisation phenomenon of the material to be deposited.

As a result, for the formation of structures comprising gallium (Ga) on a surface comprising silicon (Si), it is necessary either to previously protect the substrate surface with a protective layer, such as a layer of aluminium nitride (AlN) which has the drawback of being relatively non-conductive, or to seek growth conditions specifically suitable for the structures to be formed. These two solutions remain somewhat not ideal, since the first does not enable the formation of satisfactory electrical contact between the substrate and the structures formed and the second requires a long adaptation procedure for each type of structure to be formed.

DESCRIPTION OF THE INVENTION

The purpose of the invention is to remedy these drawbacks.

One aim of the invention is thus that of providing a method for manufacturing a semiconductor structure on a substrate surface, the structure comprising gallium and the substrate surface comprising silicon, not involving the inherent problems in the use of an aluminium nitride (AlN) nucleation layer and not requiring a long adaptation procedure.

For this purpose, the invention relates to a method for manufacturing at least one semiconductor structure on a substrate surface, said method comprising steps consisting of:
 providing the substrate, the surface whereof comprises silicon,
 forming in contact with an area of the surface, referred to as the formation area, a layer of a first material, the remainder of the surface, referred to as the free area, remaining free from the first material, the dimensions of the formation area and the first material being suitable for the formation of the structure, the first material comprising gallium, the formation of said layer taking place at a temperature less than 600° C.,
 forming the structure in contact with the layer.

Dimensions of the formation area and first material being suitable for the formation of the structure by lateral dimensions that are comprise between 100 nm and 1 µm.

Such a method makes it possible to create on the substrate surface, prior to the structure formation step, formation areas in a first material comprising gallium without the gallium from the first material interacting with the silicon from the surface or minimising the interaction between gallium and silicon. Indeed, the reactivity of gallium with silicon becomes predominant at temperatures greater than 800° C. In this way, the material wherein the formation area(s) is/are made retains a substantially identical gallium Ga composition to that of the deposited material, with gallium not tending to react with the surface.

The layer if the first material is directly in contact with the surface.

The expression "formation of the layer at a temperature less than 600° C." used above and hereinafter infers that the temperature of the substrate surface does not exceed, on average, a temperature of 600° C., or 773 K, during layer growth.

The formation areas produced, due to the composition thereof which is suitable for structure formation, has a lower nucleation energy than that of the substrate surface and thus promoting the formation of the structure on the surface. This gives rise to selective growth of the structures controlled by means of the formation areas, without needing a mask on the rest of the surface and previously providing a layer of aluminium nitride (AlN).

Furthermore, the production of the layer of the first material on the formation areas is compatible with photolithography methods and thus feasible in parallel on the entire substrate surface regardless of the dimensions thereof. Due to this possibility, such a method is particularly suitable for the mass production of semiconductor structures.

The first material can be gallium, an alloy based on gallium and indium, or an alloy based on gallium and aluminium.

The aluminium or indium proportion may be a minor proportion, the molar proportion of aluminium or indium being, for example, less than 20%.

Such first material that is an alloy based on gallium-aluminium with a reduced proportion of aluminium or an alloy based on gallium-indium with a reduced proportion of indium allows the furniture of a layer of the first material that is especially stable at room temperature.

It has to be understood, above and in the rest of this document, by an alloy based on gallium aluminium, either an binary alloy gallium-aluminium or either an superior order alloy in which gallium and aluminium molar proportion prevails, and in which the other elements are dopants, i.e each dopant element molar proportion being less than 1%, It has to be understood, above and in the rest of this document, by an alloy based on gallium indium, either an binary alloy gallium-indium or either an superior order alloy in which gallium and indium molar proportion prevails, and in which the other elements are dopants, i.e each dopant element proportion being less than 1%, The step for forming the layer of a first material comprises a sub-step for depositing the first material such as physical vapour deposition.

Such a sub-step for depositing the first material is suitable for forming a layer of a first material while limiting the interaction between gallium and the substrate surface. Indeed, a physical vapour deposition method is suitable for carrying out low-temperature deposition and a portion of the material is deposited in the form of cations, the composition wherein is based on that of the material to be deposited and not in the form of atoms. In this way, the low deposition temperature and the fact that some of the gallium atoms deposited are bound with other atoms reduces the risks of interaction between the gallium atoms and atoms of the substrate surface.

By physical vapour deposition it has to be understood above, and in the rest of this document, both sputtering deposition, as cathodic sputtering, and evaporation deposition, as pulsed laser deposition.

A step for the nitridation of the free area of the surface may be envisaged between the step for forming the layer of the first material and the step for forming the structure.

Such a nitridation step is suitable for forming, with the silicon present on the surface, a silicon nitride, only on the area of the surface not protected by the first layer, i.e. the free area. In this way, due to the change of composition of the surface thereof, the free area has a lower reactivity with respect to gallium (Ga). This silicon nitride layer is also suitable for the electrical passivation of the substrate surface on the free area, thus avoiding having to conduct a costly additional passivation step after the growth of the structure.

The nitridation step may be done on both the free area and the first material layer.

The step for forming the semiconductor structure may comprise a step for the vapour phase epitaxial growth of the first material on the first layer using metalorganic precursors so as to form at least a portion of the semiconductor structure in contact with the first layer.

The step for forming the layer of a first material may comprise sub-steps consisting of:
  forming a protective layer covering only the free area of the surface,
  depositing the first material on the formation area, the free area being protected by the protective layer,
  removing the protective layer.

The step for forming the layer may comprise sub-steps consisting of:
  depositing the first material on the entire substrate surface,
  removing the portion of the first material covering the free area.

These two options are suitable for forming the layer of the first material only on the formation areas, thus forming the wire only on the formation area.

The substrate may comprise, at least on the surface thereof, silicon in a proportion by mass greater than 30%, the substrate surface preferentially essentially consisting of silicon.

Such a method is particularly suitable for use with such a substrate. Indeed, since gallium is highly reactive with silicon, such a method makes it possible to remove the influence of this reactivity on the structures formed by such a method on a substrate having a high proportion by mass of silicon.

The step for forming the semiconductor structure is a step for forming a semiconductor wire which is, at least for the portion thereof in contact with the layer, made of the first material, in gallium nitride (GaN).

The invention also relates to a component comprising:
  a substrate wherein the surface comprises silicon,
  a semiconductor structure,
  the component further comprising
  a layer of a first material in contact with the substrate surface on an area of the surface referred to as the formation area, the remainder of the substrate surface being referred to as the free area, the first material comprising gallium,
  the structure being in contact with the layer of the first material.

Such a component may readily be produced by means of a method according to the invention, without requiring, unlike a component according to the prior art, a complex step for providing a hard mask on the surface for forming the semiconductor structure. This prevents any risk of contamination of the structure associated with the method for removing the hard mask which generally needs to be carried out for a component according to the prior art after structure formation.

The substrate may comprise, at least on the surface thereof, a 20% proportion by mass of silicon (Si).

The substrate may be a silicon Si substrate.

Such a component comprises an enhanced interface between the structure and the substrate with respect to a component according to the prior art wherein the substrate has the same proportion by mass on the surface thereof. Indeed, with such a component, the formation of the structure does not give rise to interaction between the silicon in the substrate and the gallium in the structure which degrades the interface between the structure and the substrate without requiring a buffer layer.

The substrate surface of the free area may consist of a nitrided material.

The structure may be a semiconductor wire with, at least for the portion in contact with the layer, made of the first material, in gallium nitride GaN.

BRIEF DESCRIPTION OF THE FIGURES

The present invention will be understood more clearly on reading the description of examples of embodiment, provided merely as an indication and in no way as a limitation, with reference to the appended figures wherein.

Identical, similar or equivalent parts of the various figures bear the same reference numbers to enable easier comparison of the figures.

The various parts shown in the figures are not necessarily based on a uniform scale, so as to make the figures easier to read.

DETAILED DESCRIPTION OF PARTICULAR EMBODIMENTS

The present invention relates to the manufacture of three-dimensional structures, for example microwires, nanowires or pyramid-shaped elements. Embodiments for manufacturing microwires or nanowires are described hereinafter in the description. However, these embodiments may be used for manufacturing three-dimensional structures other than microwires or nanowires, for example for manufacturing pyramid-shaped three-dimensional.

Throughout this document, the term wires refers to semiconductor nanowires or microwires of semiconductor structures having three dimensions and an elongated shape, wherein two are of the same order of magnitude between 5 nm and 2.5 μm, the third dimension being at least equal to 2 times, 5 times or preferentially 10 times the greater of the two other dimensions.

In some embodiments, the transverse dimensions may be less than or equal to approximately 1 μm, preferably between 100 nm and 300 nm. In some embodiments, the height of each nanowire, or longitudinal dimension, may be greater than or equal to 500 nm, preferably between 1 μm and 50 μm.

FIGS. 1a to 1e illustrate the main steps of a method for manufacturing structures according to a first embodiment of the invention in a particular application to gallium nitride (GaN) semiconductor wires 130 on a silicon (Si) substrate 100.

Such a particular application is a preferred application of the invention. Nonetheless, this invention is not limited to the manufacture of gallium nitride (GaN) wires 130 on a silicon (Si) substrate 100 and also covers methods for manufacturing semiconductor wires made of another semiconductor material than gallium nitride comprising gallium, such as gallium arsenide (GaAs), indium-gallium nitride (InGaN) or aluminium-gallium nitride (AlGaN), on a substrate which may be silicon or be a substrate comprising silicon on the surface thereof.

Figure 1A:
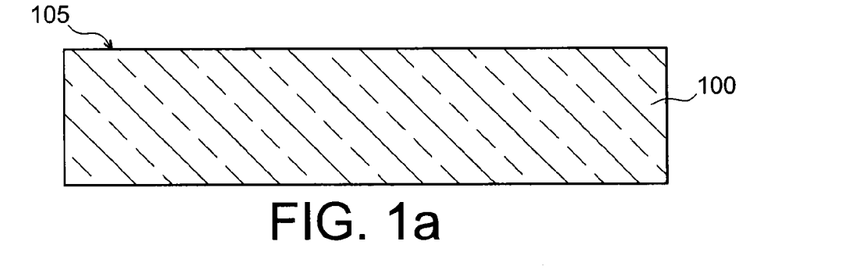
FIGS. 1a to 1e illustrate sectional views of the various steps for forming structures according to a first embodiment
Figure 1B:
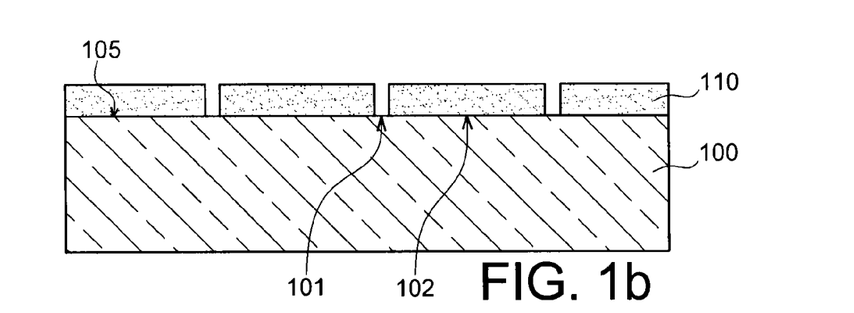
Figure 1C:
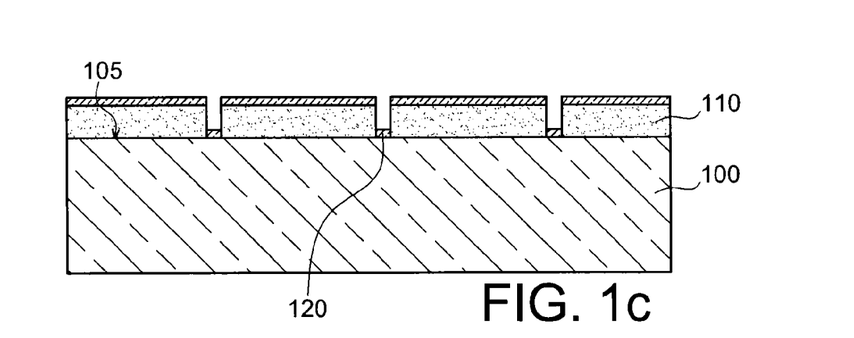
Figure 1D:
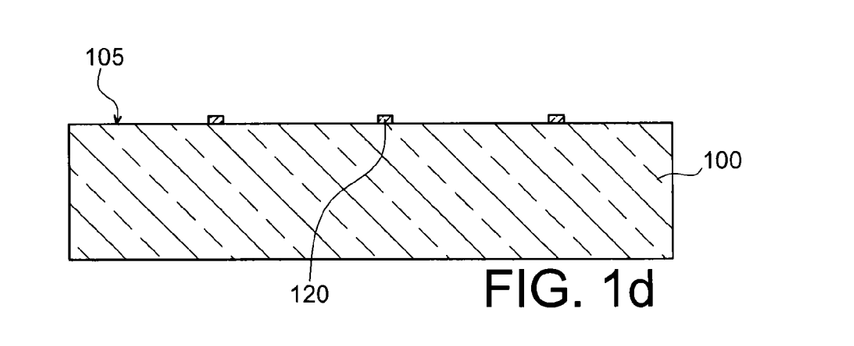
Figure 1E:
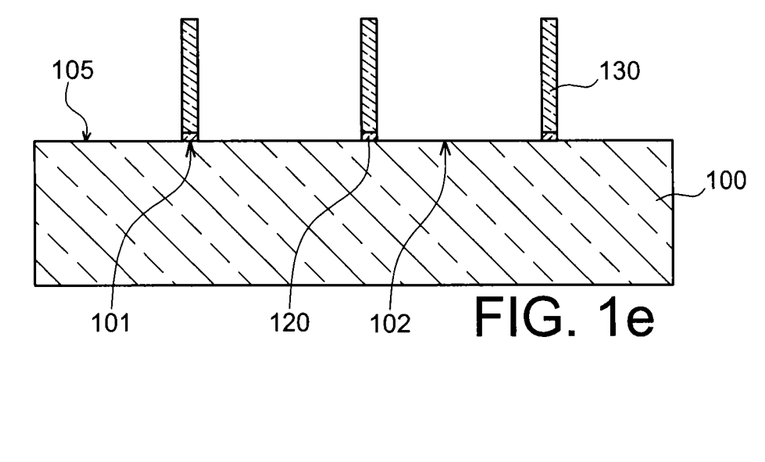

Such a manufacturing method comprises steps consisting of:

providing the substrate 100, as illustrated in FIG. 1a, depositing, as illustrated in FIG. 1b, a mask 110 on the substrate surface, the mask 110 only leaving the areas 101 of the surface intended for the formation of the semiconductor wires, referred to as the formation areas, free, the remainder 102 of the surface 105 representing a so-called free area, depositing, as illustrated in FIG. 1c, a layer 120 of a first material comprising gallium on the formation areas 101, the free area 102 being protected by the mask 110, removing, as illustrated in FIG. 1d, the mask 110 so as to free the free area 102 and only leave, on the surface 105, the formation areas 101 coated with the first material, the free area 102 being free from the first material and the mask 110, growing, as illustrated in FIG. 1e, the wires 130 by depositing a second material comprising gallium, this growth essentially taking place in contact with the formation areas 101 having, due to the composition of the first material, a lower nucleation energy to that of the free area 102.

The step for providing the substrate 100 more specifically consists of providing a substantially flat substrate, of which one of the surfaces 105 is intended for the formation of the semiconductor wires 130. Such a substrate 100 is generally a semiconductor substrate such as for example a substrate made of silicon (Si), silicon carbide (SiC) or sapphire ($Al_2O_3$) comprising a surface comprising silicon (Si).

For easier comprehension, hereinafter in the document, the term surface refers to the surface 105 of the substrate 100 intended for the formation of the wires 130. According to the invention, this surface consists of a material comprising silicon.

The substrate 100 may also be made of a non-semiconductor material such as glass ($SiO_2$), or merely comprise a semiconductor layer extending along the surface 105 intended for the formation of the wires 130, without leaving the scope of the invention. According to one particularly suitable option of the application of the invention, the substrate 100 has on the surface 105 thereof a proportion by mass of silicon (Si) greater than 30%.

As mentioned above, in the particular application, the substrate 100 is a silicon substrate used in the microelectronic and optoelectronic industries. The type of conductivity and concentration of majority carriers are defined based on the type of component to be formed from the wires 130 obtained by means of the method according to the invention. In this way, the type of conductivity of the substrate may be, for example, such that the majority carriers are electrons with a majority carrier concentration greater than $10^{18}$ $cm^{-3}$. Such a concentration is particularly suitable for enabling polarisation by the substrate.

The mask 110 formed during the step for forming the mask 110 is a mask conventionally used in the microelectronic industry such as for example a mask made of silica, silicon nitride or, if the deposition temperature of the layer 120 is less than 100° C., a polymer resin. The mask 110 is suitable for covering the free area 102 and leaving the formation areas 101 free. Since such steps for forming masks 110 are well-known to those skilled in the art, this step will not be described in more detail in this document.

The mask 110 acts as a protective layer of the free area.

For the particular application, each of the formation areas 101 is in the shape of a disk wherein the diameter is between 50 nm and 5 μm. In this way, it is possible to distribute the formation areas 101 on the substrate surface with a density between $10^5$ and $10^8$ areas per centimeter squared. Obviously, according to this particular application, the shape of each of the formation areas 101 may be different to that of a disk, such as for example a shape defined by a hexagon, by a square or by a rectangle.

The layer 120 of first material deposited during the step for depositing the first material consists of a semiconductor material containing gallium Ga. In this way, the first material may equally well be a binary semiconductor, such as gallium arsenide (GaAs) and gallium nitride (GaN), or a ternary semiconductor, such as indium-gallium arsenide (InGaAs), indium-gallium nitride (InGaN) and aluminium-gallium nitride (AlGaN), or a quaternary semiconductor such as for example indium-gallium arsenide-phosphide (InGaAsP).

In a preferred option of the invention, the first material layer 120 is gallium, an alloy based on gallium and indium or an alloy based on aluminium and gallium. According to this possibility, in the case of an alloy based on aluminium and gallium or gallium and indium, the gallium concentration is predominant, the molar proportion of aluminium or indium being a minor proportion that is preferably less than 20%.

This step for depositing the first material is conducted using a deposition method suitable for ensuring that the formation temperature of the layer 120 of the first material remains less than 600° C. (or 873 K). Such a formation temperature of the layer 120 of the first material means that the temperature of the substrate surface 105 is on average less than 600° C. throughout the step for forming the layer 120. The temperature of the substrate surface 105 is, according to one preferred option of the invention, less than 600° C. throughout the step for forming the layer 120.

In this way, during this step, the deposition method used may be for example a, a physical vapour deposition (or PVD) method such as cathode sputtering or pulsed laser deposition (or PLD) method.

A deposition method enabling a formation temperature of the layer of the first material which is less than 600° C. is suitable for limiting the interaction between the gallium atoms of the first material and those of the surface 105 during the formation of the first layer 120. This avoids degradation both of the surface 105 and the layer 120 of the first material which would be detrimental to the formation of the structures.

During this step, the thickness of the layer 120 of material deposited is preferentially chosen between 3 nm and 100 nm and advantageously between 3 and 30 nm.

In the particular application, since the wires 130 which are intended to be formed on the surface 105 are gallium nitride GaN wires, the first material is gallium nitride GaN and the layer 120 of said first material is formed during reactive cathode sputtering. According to this option, the deposited material may comprise a small proportion of silicon so as to form a layer 120 of the first material made of gallium nitride GaN with silicon as the dopant element.

The step for removing the mask 110 is carried out during selective etching of the material forming the mask 110 which is suitable for not etching the surface 105 of the substrate and that of the first material. This etching may be either liquid etching or dry etching, such as reactive ion etching. Since such selective etching methods are known to those skilled in the art and are not specific to the invention, they are not explained in more detail in this document.

In respect of the step for forming the structures 130, this is obtained by means of a deposition method conventionally used for the formation of semiconductor structures. In this step, the second material is preferentially substantially identical to the first material. A second material substantially identical to the first material enables the formation areas 101 to have nucleation energy during the deposition of the second material which is considerably lower than that of the surface of the free area 102. Indeed, under these conditions, the lattice parameter of the layer 120 of the first material is substantially identical to that of the second material, the deposition of the second material on the layer 120 of the first material is in fact homo-epitaxy. This ensures satisfactory selectivity of the growth of the structures 130 which takes place essentially, even exclusively, on the formation areas 101.

In the particular application, the second material is substantially identical to the first material and is thus gallium nitride GaN. In this particular application, the deposition method used during the step for forming the structures 130 is preferentially a metalorganic chemical vapour deposition (MOCVD) step.

Obviously, whether within the general context of the invention or within the scope of the particular application, only the composition of the part of each of the structures 130 formed in contact with the corresponding formation area 101 preferentially consists of a second material substantially identical to the first material. The remainder of each of the structures 130 may have a different composition so as to form functional areas for each of the structures according to the intended application.

Such a method is thus suitable for manufacturing structures 130 comprising gallium (Ga) by offering, by promoting the growth of the structures 130 on areas of the substrate surface, monitoring of structure formation. Furthermore, it is suitable for the mass production of structures and does not involve inherent problems in the use of a mask 110 during the growth of the structures 130.

Such structures 130 are suitable for manufacturing a semiconductor component. Such a component, not shown, comprises
- a substrate 100,
- a layer 120 of the first material in contact with the surface 105 of the substrate 100 on the formation areas 101, the first material comprising gallium,
- a plurality of semiconductor structures 130 each in contact with one of the formation areas 101.

FIGS. 2a to 2d illustrate the main steps of a production method according to a second embodiment of the invention. Such a method is distinguished from a method according to the first embodiment in that the formation step on the entire surface 105 of the substrate 100 whereon the structures 130 are to be formed, in that the mask 110 is deposited in contact only with the formation areas 101, the free area 102 being free from the mask and in that, between the step for forming the mask 110 and the step for removing the mask 110, a selective etching step is provided suitable for etching the parts of the layer 120 of the first material which is not protected by the mask 110.

Figure 2A:
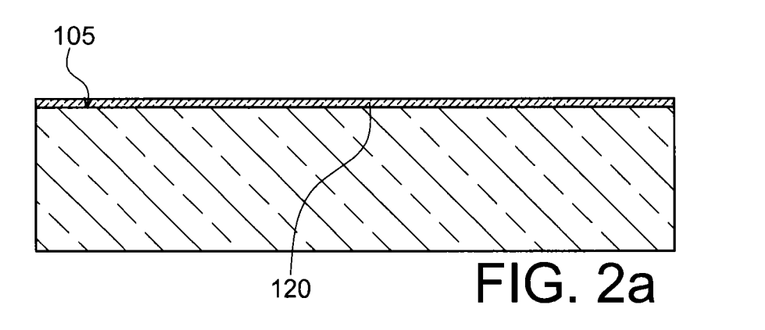
FIGS. 2a to 2d illustrate sectional views of the various steps for preparing the layer of the first material on the formation areas according to a second embodiment of the invention.
Figure 2B:
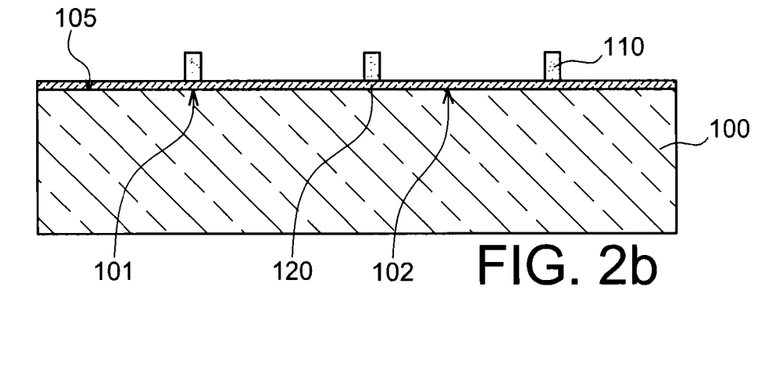
Figure 2C:
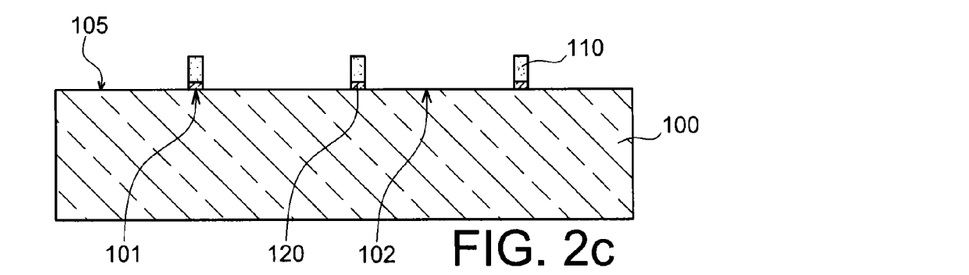
Figure 2D:
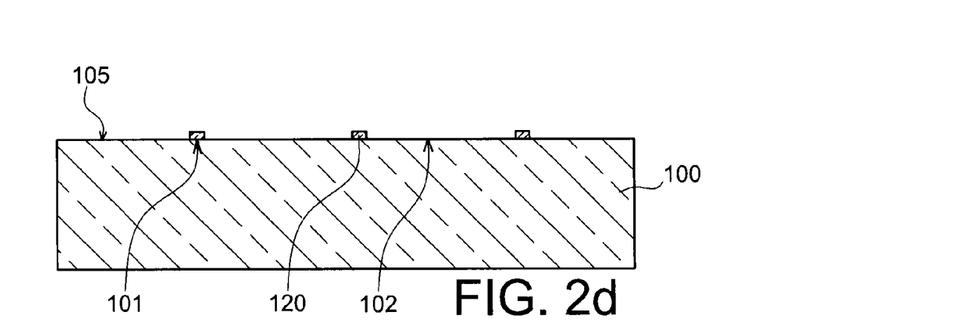

In this way, a manufacturing method according to this second embodiment comprises steps consisting of:
providing a substrate 100, identically to the step of the manufacturing method according to the first embodiment illustrated in FIG. 1a,
depositing, as illustrated in FIG. 2a, a layer 120 of the first material comprising gallium on the surface 105 of the substrate 100 intended to be in contact with the structures 130,
depositing, as illustrated in FIG. 2b, a mask 110 on the surface of the layer 120 of the first material, this mask 110 only covering the formation areas 101, the parts of the layer 120 of the first material covering the free area 102 not being covered by the mask 110,
removing, as illustrated in FIG. 2c, the parts of the layer 120 of the first material covering the free area 102, the parts of the layer 120 of the first material covering the formation areas 101 being protected by the mask 110,
removing, as illustrated in FIG. 2d, the mask 110 so as to free the parts of the layer 120 of the first material covering the formation areas 101,
growing, in the same way as the step of the manufacturing method according to the first embodiment illustrated in FIG. 1e, the wires 130 by depositing a second material comprising gallium Ga, this growth essentially taking place in contact with the formation areas 101 which have, due to the composition of the first material, a lower nucleation energy than that of the free area 102.

The step for removing the parts of the layer 120 of the first material covering the free area 102 may be carried out by means of selective etching of the layer 120 of the first material suitable for not etching the surface of the substrate 100 and the mask 110.

The other steps of the method according to the second embodiment are identical to those of a method according to the first embodiment of the invention.

Figure 3A:
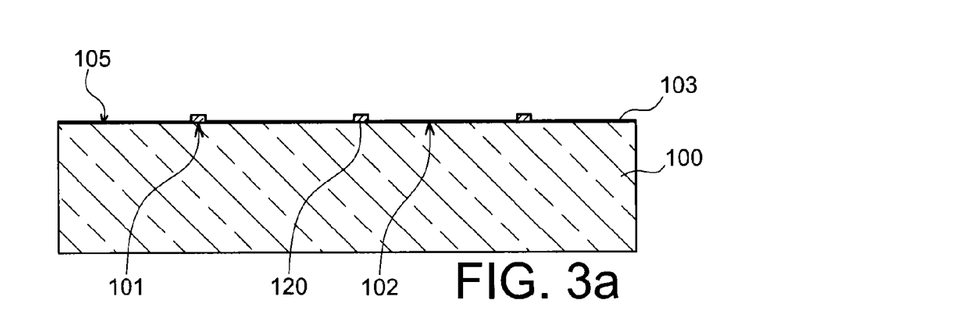
FIGS. 3a and 3b illustrate, respectively, a sectional view of the step for the nitridation of the free areas of the surface and the step for growing the structures according to a third embodiment of the invention.
Figure 3B:
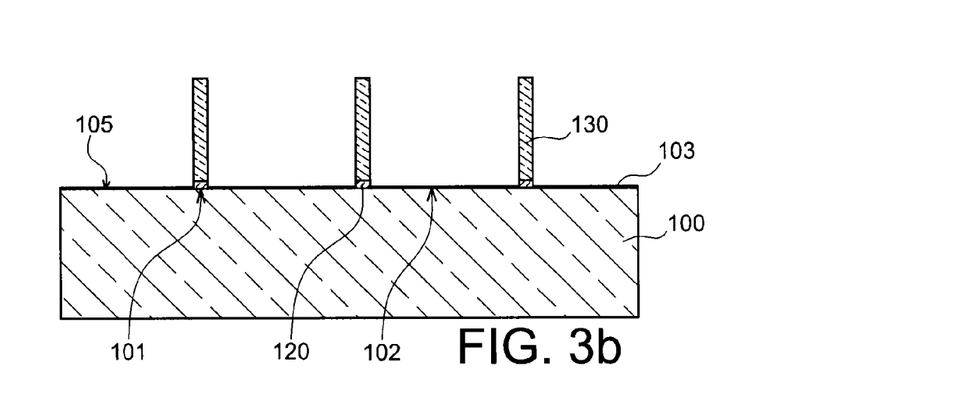

FIGS. 3a and 3b illustrate two steps of a manufacturing method according to a third embodiment of the invention. A manufacturing method according to the third embodiment is distinguished from a method according to the second embodiment in that it comprises, between the step for removing the mask 110 and the step for forming the wires 130, a step for the nitridation of the surface 105 of the free area 102.

The nitridation step consists of subjecting the substrate 100 to a stream of nitrogen $N_2$, or ammonia $NH_3$, at a high temperature in order to obtain a nitridation reaction between the silicon Si of the surface 105 of the substrate 100 and the atoms of nitrogen N. The conditions for carrying out such a step are described in the article published in the journal "Thin Solid films" 474 in 2005 on pages 326 to 329 by Z. HONGLIANG et al.

Such a step is suitable for forming on the surface 105 of the substrate 100 a layer of silicon nitride SiN 103 on the free area 102. A layer of silicon nitride 103 formed in this way subjects the surface 105 of the substrate 100 to chemical and electrical passivation on the free area 102. With such a passivation of the surface 105 of the substrate 100 on the free area 102, the growth of the second material then being inhibited on the free area 102, the selectivity of the growth of the second material on the formation areas 101 is increased with respect to that of the first and second embodiment.

The nitridation step may be done on both the free area and the first material layer.

Preferably, the nitridation conditions are suitable for forming a thickness of silicon nitride (SiN) which is less than half of the smallest surface dimension of the formation areas 101. Such a silicon nitride thickness condition is suitable for providing high-quality electrical contact between the substrate and the wires.

Such a layer of silicon nitride 103 is suitable for optimising the electrical passivation of the substrate on the areas of the substrate on the free area 102 corresponding to the parts of the surface which are not in contact with the wires, without requiring additional steps, as implemented in the prior art, generally involving costly lithography steps.

In this document, while the wires described are semiconductor wires wherein the composition is homogeneous along the entire length thereof, the wires formed during the step for forming the wires may be, without leaving the scope of the invention, wires comprising a varied composition on at least part of the height thereof, such as for example so as to form a semiconductor junction of a light-emitting diode. Similarly, the wires formed during the step for forming the wires may be core-shell wires, the composition of the wire being radially varied.

The invention claimed is:

1. A manufacturing method for manufacturing at least one semiconductor structure on a surface of a substrate, the method comprising steps of:
providing the substrate, the surface whereof comprises silicon;
forming in contact with an area of the surface, referred to as a formation area, a layer of a first material, a remainder of the surface, referred to as a free area, remaining free from the first material, dimensions of the formation area and the first material being suitable for formation of the structure with a transverse dimension of the formation area being between 100 nm and 1 µm, the first material comprising gallium, the forming step forming the layer at a temperature less than 600° C.; and
forming the structure in contact with the layer, wherein the forming step of the layer of the first material in contact with the surface comprises sub-steps of:
depositing a mask, referred to as a protective layer, on the surface, the protective layer covering only the free area, the formation area remaining free of the protective layer,
depositing the first material on the formation area at a temperature less than 600° C., the free area being protected by the protective layer, and
removing the protective layer.

2. The manufacturing method according to claim 1, wherein the step for forming the layer of the first material comprises a sub-step for depositing the first material by physical vapour deposition.

3. The manufacturing method according to claim 1, further comprising: a step of nitridating the free area of the surface, the step of nitridating being performed between the step for forming the layer of the first material and the step for forming the structure.

4. The manufacturing method according to claim 1, wherein the step for forming the semiconductor structure comprises a step of vapour phase epitaxial growing of the first material on the layer using metalorganic precursors so as to form at least a portion of the semiconductor structure in contact with the layer.

5. The manufacturing method according to claim 1, wherein the substrate comprises, at least on the surface thereof, silicon in a proportion by mass greater than 30%, the surface of the substrate essentially consisting of silicon.

6. The manufacturing method according to claim 1, wherein the step for forming the structure is a step for forming a semiconductor wire which is, at least for the part thereof in contact with the layer, made of the first material, in gallium nitride GaN.

7. A manufacturing method for manufacturing at least one semiconductor structure on a surface of a substrate, the method comprising steps of:
prov018 the substrate, the surface whereof comprises silicon;
forming in contact with an area of the surface, referred to as a formation area, a layer of a first material, a remainder of the surface, referred to as a free area, remaining free from the first material, dimensions of the formation area and the first material being suitable for formation of the structure with a transverse dimension of the formation area being between 100 nm and 1 µm, the first material comprising gallium, the forming step forming the layer at a temperature less than 600° C.; and
forming the structure in contact with the layer, wherein
the forming step of the layer of the first material in contact with the surface comprises sub-steps of:
depositing the first material on the entire substrate surface at a temperature less than 600° C.,
depositing a mask, referred to as a protective layer, on a portion of the first material which covers the formation area, the rest of the first material which covers the free area remaining free of the protective layer,
removing the first material which is not protected by the protective layer and which covers the free area, the portion of the first material which covers the formation area being protected by the protective layer, and
removing the protective layer.

8. A manufacturing method for manufacturing at least one semiconductor structure on a surface of a substrate, the method comprising steps of:
providing the substrate, the surface whereof comprises silicon;
forming in contact with the surface at a designated emplacement, referred to as a formation area, a layer of a first material, a remainder of the surface, referred to as a free area, remaining free from the first material, dimensions of the formation area and the first material being suitable for formation of the structure with a transverse dimension of the formation area being between 100 nm and 1 µm, the first material comprising gallium, the forming step forming the layer at a temperature less than 600° C.; and
forming the structure in contact with the layer.

* * * * *